US008553752B2

(12) United States Patent
Beyene et al.

(10) Patent No.: US 8,553,752 B2
(45) Date of Patent: Oct. 8, 2013

(54) METHOD AND APPARATUS FOR DETERMINING A CALIBRATION SIGNAL

(75) Inventors: Wendemagegnehu Beyene, San Jose, CA (US); Kevin S. Donnelly, Los Altos, CA (US); Mark A. Horowitz, Menlo Park, CA (US)

(73) Assignee: Rambus Inc., Sunnyvale, CA (US)

( * ) Notice: Subject to any disclaimer, the term of this patent is extended or adjusted under 35 U.S.C. 154(b) by 863 days.

(21) Appl. No.: 12/596,133

(22) PCT Filed: Jan. 30, 2008

(86) PCT No.: PCT/US2008/052502
§ 371 (c)(1),
(2), (4) Date: Mar. 29, 2010

(87) PCT Pub. No.: WO2008/144081
PCT Pub. Date: Nov. 27, 2008

(65) Prior Publication Data
US 2010/0296566 A1  Nov. 25, 2010

Related U.S. Application Data

(60) Provisional application No. 60/931,726, filed on May 24, 2007.

(51) Int. Cl.
*H04B 17/00* (2006.01)
(52) U.S. Cl.
USPC ............ 375/227; 375/226; 375/224; 375/296

(58) Field of Classification Search
USPC .......................................... 375/227; 370/503
See application file for complete search history.

(56) References Cited

U.S. PATENT DOCUMENTS

| 6,775,809 | B1 * | 8/2004 | Lambrecht et al. ............ 716/136 |
| 6,920,402 | B1 | 7/2005 | Liaw |
| 7,089,161 | B1 * | 8/2006 | Verma et al. ....................... 703/2 |
| 2003/0019929 | A1 * | 1/2003 | Stewart et al. ................. 235/385 |
| 2005/0204245 | A1 | 9/2005 | Lee |
| 2007/0030890 | A1 | 2/2007 | Yamaguchi |

* cited by examiner

*Primary Examiner* — Eva Puente
(74) *Attorney, Agent, or Firm* — Mahamedi Paradice Kreisman LLP; Lance M. Kreisman

(57) ABSTRACT

Embodiments of a system for determining and optimizing the performance a signaling system are described. During operation, the system captures or measures a single-bit response (SBR) for the signaling system. Next, the system constructs an idealized inter-symbol-interference-free (ISI-free) SBR for the signaling system which is substantially free of inter-symbol-interference (ISI). The system then calculates an ISI-residual from the captured SBR and the idealized ISI-free SBR. Next, the system constructs a calibration bit pattern for the signaling system that is based substantially on the ISI-residual. Finally, the system uses the calibration bit pattern to calibrate, optimize and determine an aspect of the performance of the signaling system.

36 Claims, 11 Drawing Sheets ized ISI-free SBR from the captured SBR. Next, the system constructs a calibration bit pattern for the signaling system that is based substantially on the ISI-residual. Finally, the system uses the calibration bit pattern to calibrate, optimize and/or determine an aspect of the performance of the signaling system.

METHOD AND APPARATUS FOR DETERMINING A CALIBRATION SIGNAL

BACKGROUND

1. Field

The present embodiments generally relate to signaling systems. More specifically, the present embodiments relate to efficient techniques for calibrating and optimizing signaling systems based on measured channel characteristics.

2. Related Art

As technological advances continue to make digital signaling systems faster, it is becoming increasingly harder to accurately determine voltage and timing margins for these systems. These voltage and timing margins are used both to determine the performance of the signaling system and to calibrate signaling operations by determining an optimal sampling point.

Existing techniques for characterizing voltage and timing margins use very long and complex pseudo-random bit sequences (PRBS) which exercise possible transition sequences and to thereby stress the system. For example, referring to FIGS. 1A and 1B, the timing margins for a high-speed communication channel obtained using less complex PRBSs are significantly larger than the timing margins obtained using PRBS15 ($2^{15}$-1 bits). More specifically, both the eye height and eye width for the channel decrease as the complexity of the PRBS increases. Note that there exist significant differences in voltage and timing margins determined using PRBS7 and corresponding margins determined using PRBS15. Also note that the curves do not plateau at PRBS15. Consequently, PRBS15 does appear to reflect the worst-case voltage and timing margins.

Unfortunately, it is impractical to routinely measure or simulate a digital system using PRBS15 (or a longer PRBS) because the required time to use PRBS increases exponentially as the complexity of the PRBS increases.

Hence, what is needed is a method and an apparatus for determining the performance of a digital signaling system without the above-described problems.

DETAILED DESCRIPTION

Figure 1A:
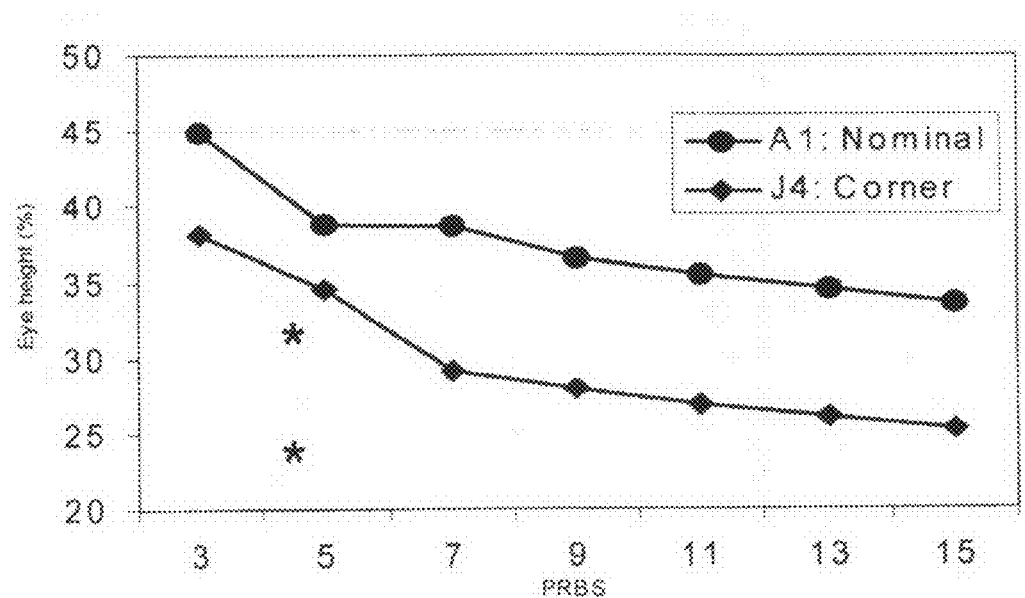
FIG. 1A presents an exemplary graph illustrating the height of an eye diagram as a function of PRBS length (and also the eye height resulting from a short bit pattern generated using the proposed method).
Figure 1B:
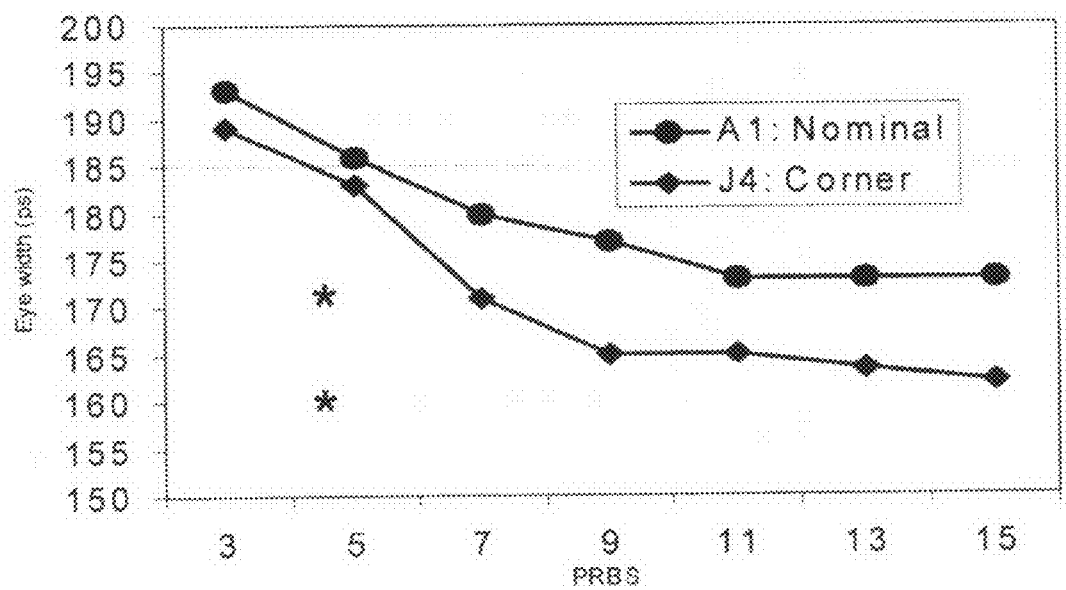
FIG. 1B presents an exemplary graph illustrating the width of an eye diagram as a function of PRBS length (and also the eye width resulting from a short bit pattern generated using the proposed method)

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not limited to the embodiments shown, but is to be accorded the widest scope consistent with the features disclosed herein.

Embodiments of a system that determines and optimizes the performance a signaling system are described. During operation, the system captures or measures a single-bit response (SBR) for the signaling system. The SBR waveform can also be derived from step response or other characteristic functions of the signaling system. Next, the system constructs an idealized inter-symbol-interference-free (ISI-free) SBR for the signaling system, which is substantially free of inter-symbol-interference (ISI). The system then calculates an ISI-residual from the captured SBR and the idealized ISI-free SBR. Next, the system constructs a calibration bit pattern for the signaling system that is based substantially on the ISI-residual. Finally, the system uses the calibration bit pattern to calibrate, optimize and/or determine an aspect of the performance of the signaling system.

In some embodiments, constructing the idealized ISI-free SBR involves constructing a distortionless SBR using a raised cosine pulse or other suitable pulses.

In some embodiments, constructing the idealized ISI-free SBR involves using the delay of the channel (obtained from the SBR) and the amplitude of the SBR as parameters while constructing the idealized ISI-free SBR.

In some embodiments, calculating the ISI-residual involves subtracting the idealized ISI-free SBR from the captured SBR.

In some embodiments, determining the performance of the signaling system involves determining one or more of: a timing margin, a voltage margin, a true center of a signal eye, a channel performance, or a bit error rate.

In some embodiments, determining the performance of the signaling system involves using the calibration bit pattern to generate an eye diagram for the signaling system.

In some embodiments, constructing the calibration bit pattern involves using non-zero sample values at the centers or the edges of bit times in the ISI-residual to construct the calibration bit pattern.

In some embodiments, constructing the calibration bit pattern involves assigning logic one or logic zero to successive bits in the calibration bit pattern based on the polarity of the ISI-residual at the centers or the edges of successive bit times.

In some embodiments, constructing the calibration bit pattern involves assigning a logic one or a logic zero to successive bits in the calibration bit pattern based on the polarity of an area in an interval surrounding the centers or the edges of successive bit times of the ISI-residual.

In some embodiments, the calibration bit pattern is generated until a termination condition is reached, where the termination condition is reached when: the sample values at the centers or the edges of bit times approach zero; or after a pre-specified number of bits are generated.

In some embodiments, determining the performance of the signaling system additionally involves calibrating the signaling system, which can involve, for example, optimizing or calibrating equalization coefficients for digital filters for the signaling system.

In some embodiments, optimizing the signaling system additionally involves using the short bit pattern to efficiently and accurately optimize the transmit and receive equalization coefficient values.

In some embodiments, optimizing the signaling system also involves using the short bit pattern to guide the adaptation of linear and decision feedback (DFE) equalization coefficients and clock data recovery (CDR) phase location.

In some embodiments, the signaling system is one of: a partial-response signaling system, a multi-level signaling system, a Doubinary signaling system, a modified Doubinary signaling system, a coded-signal-based signaling system, a binary non-return-to-zero (NRZ) signaling system, or a binary return-to-zero (RZ) signaling system.

In some embodiments, the performance is determined at one of the following times: during the process of manufacturing the signaling system; during system initialization; or during a periodic recalibration operation performed while the signaling system is operating.

Embodiments of a system for calibrating a signaling system are also described. During operation, the system determines channel characteristics of the signaling system. Next, the system creates a calibration bit pattern based substantially on the determined channel characteristics. The system then uses the calibration bit pattern to calibrate an aspect of the signaling system.

Determining the Performance of a Signaling System

In some embodiments, characteristics and performance of a signaling system can be determined by the shape of a single-bit response (SBR). In particular, the voltage and time margins can be determined by the size of the pulse response at the centers and edges of successive bit times until the tail of the response goes to zero.

Figure 2A:
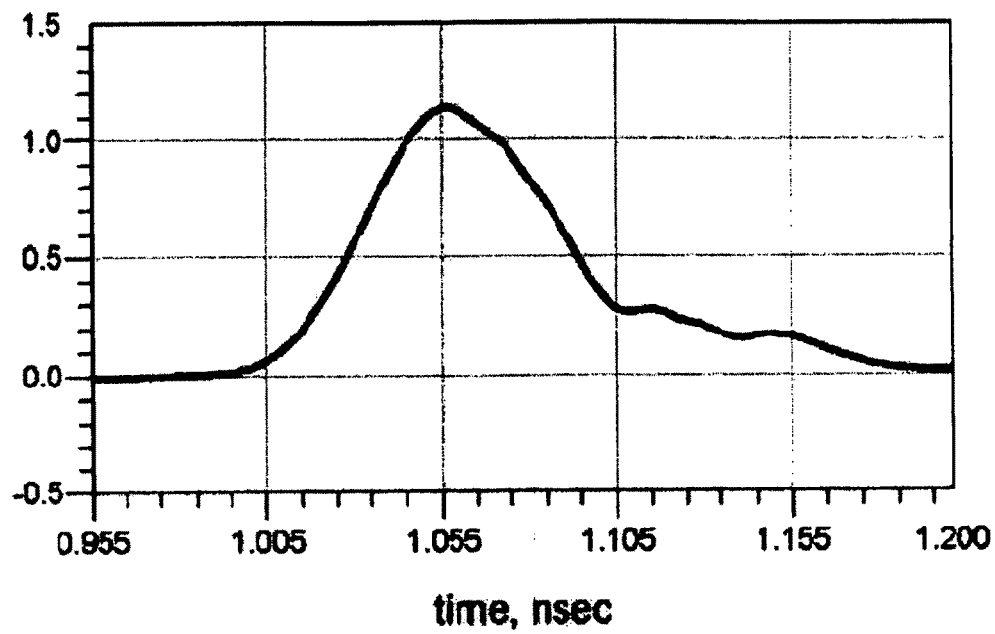
FIG. 2A illustrates an exemplary single-bit response (SBR).
Figure 2B:
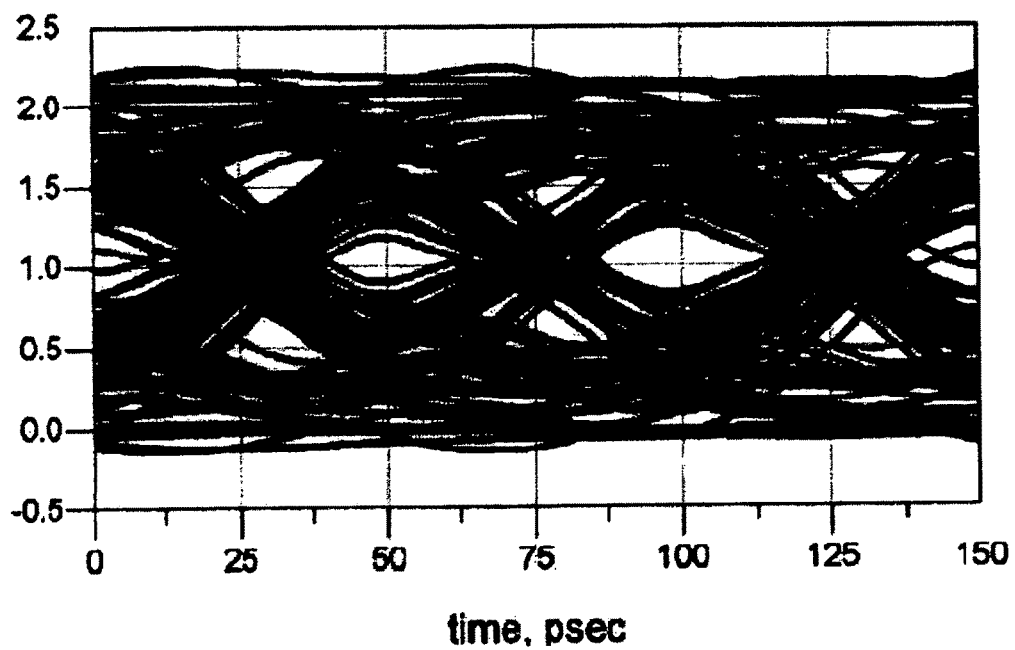
FIG. 2B illustrates an exemplary NRZ eye diagram.

FIGS. 2A and 2B illustrate a single-bit response (SBR) and a received eye diagram of a typical NRZ signaling system operating at 20 Gbps. The pulse broadening, shown in FIG. 2A, is caused by the frequency-dependent behaviors of the signaling system (which includes the channel, transmitter, and receiver), reflection, and coupling from adjacent channels.

Figure 3A:
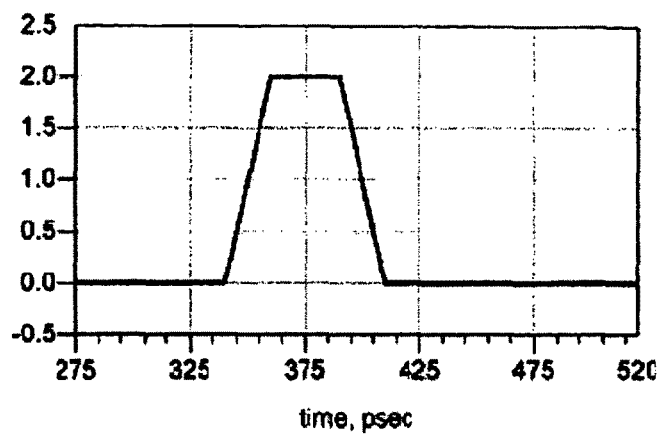
FIG. 3A illustrates an exemplary idealized transmitted pulse.
Figure 3B:
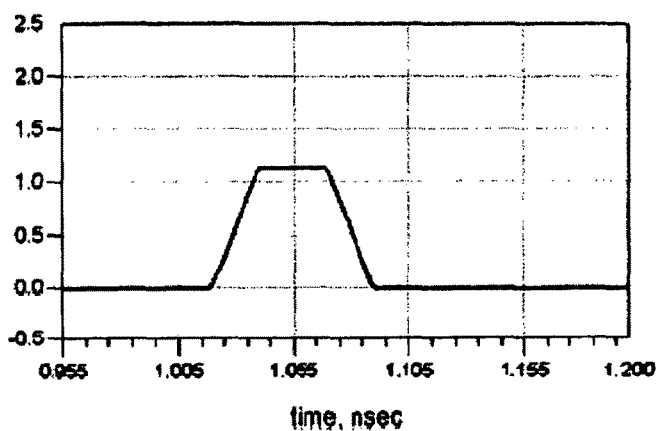
FIG. 3B illustrates an exemplary idealized received pulse.
Figure 3C:
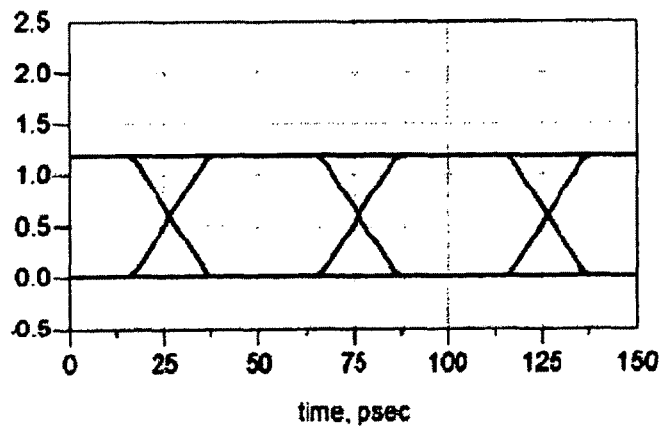
FIG. 3C illustrates an exemplary idealized NRZ eye diagram.

If these frequency-dependent behaviors are completely eliminated by use of equalization or signal conditioning techniques (for example by using an infinite-order filter), the received waveform would have zero jitter. Then, the transmitted signal is only delayed and attenuated without spreading to its neighboring bit times. For example, a transmitted pulse, a received pulse response and an eye diagram of a dispersionless system are shown, respectively, in FIGS. 3A-3C. Note that the received pulse response is identical to the transmitted pulse except for a delay and attenuation. In such an ideal signaling system, the eye diagram shows no timing jitter.

Figure 4A:
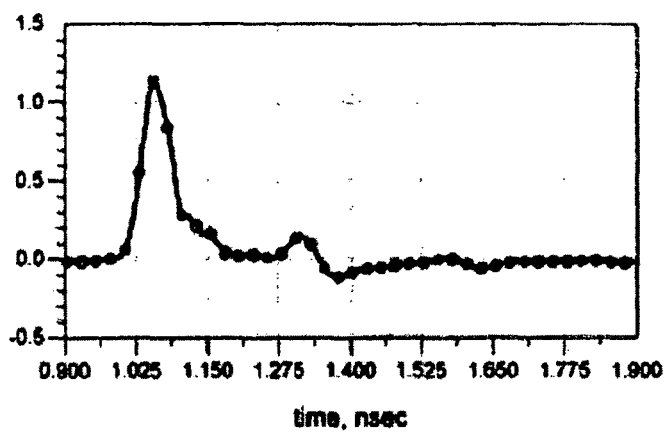
FIG. 4A illustrates an exemplary captured SBR.
Figure 4B:
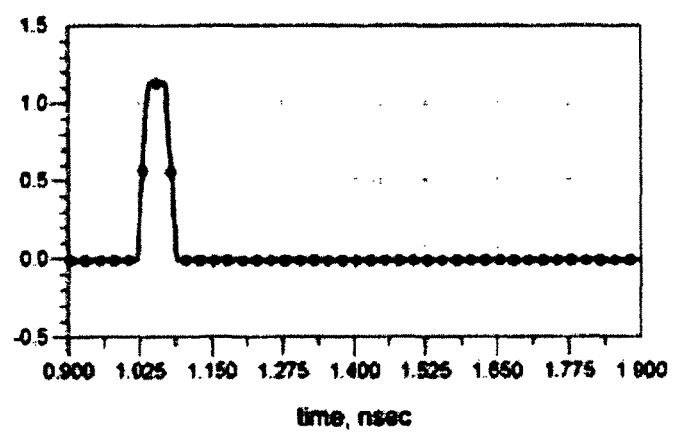
FIG. 4B illustrates an exemplary distortionless pulse response pulse.
Figure 4C:
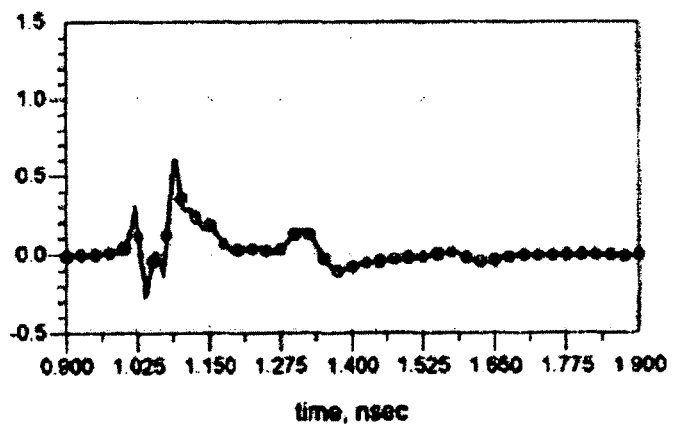
FIG. 4C illustrates an exemplary residual ISI waveform.

FIGS. 4A-4C illustrate that the single-bit response of a high-speed interface (FIG. 4A) can be decomposed into (1) an SBR of a dispersionless system (FIG. 4B) and (2) a residual ISI waveform (FIG. 4C) Moreover, the residual ISI waveform at or around the centers and edges of the bit times can be used to construct a short data pattern that can be used to efficiently measure the voltage and timing margins. This short worst-case bit pattern can be used to predict the true performance, voltage and timing margins, of the signaling system.

A channel is said to be distortionless (non-distorting) or ideal if the amplitude response of the channel is constant and the phase is a linear function of frequency. Hence, a distortionless system can be represented by a constant gain and delay terms. Although the behavior of such a system can be easily described, this type of system is not physical. The timing margins at the edges are very sensitive to small timing uncertainties. Therefore, such a decomposition can only give a reliable measure of performance (voltage margin) when the received eye has a flat region. Unfortunately, this type of flat region no longer exists in eye diagrams as signaling systems begin to operate at very high data rates.

Figure 5A:
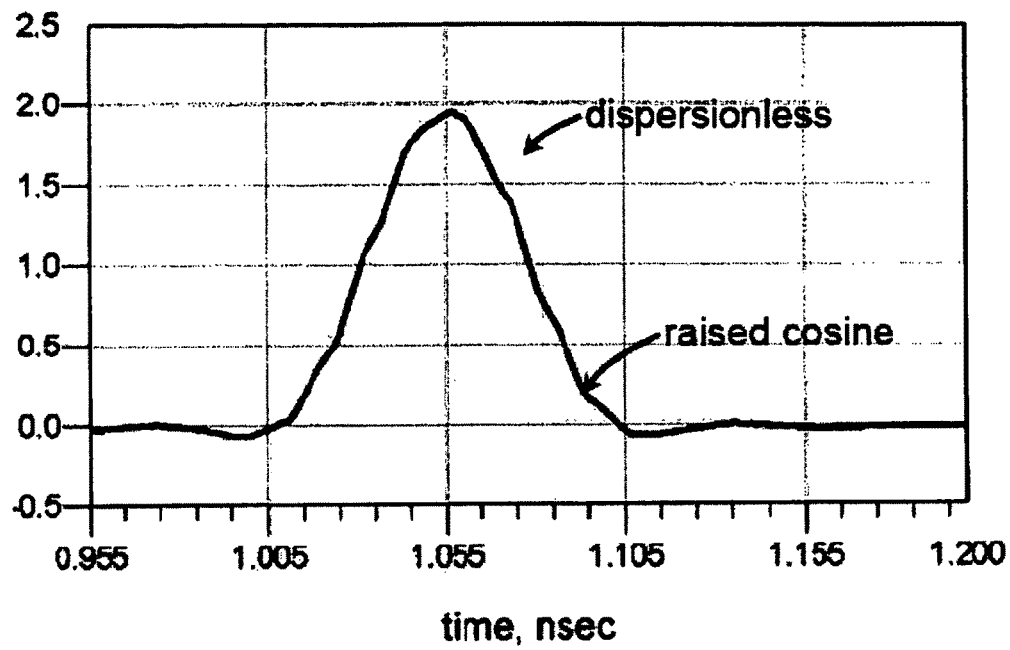
FIG. 5A illustrates an exemplary raised cosine pulse.
Figure 5B:
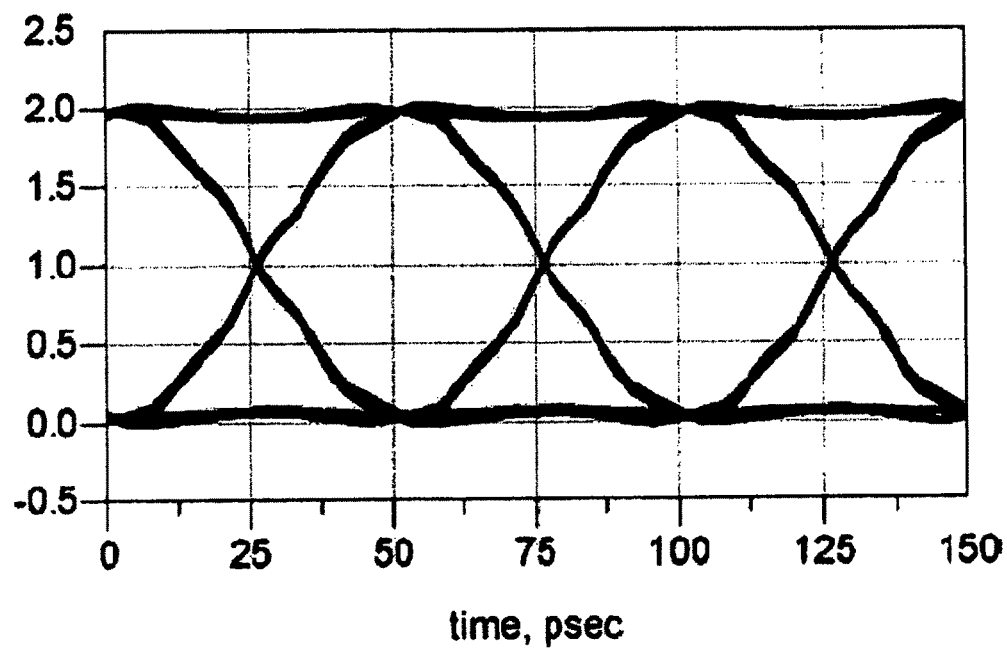
FIG. 5B illustrates an exemplary NRZ eye diagram with a raised cosine filter.

The response of the distortionless system can be modified, however, using a common low-pass filter to represent the response of physically realizable system. A commonly used pulse that has zero ISI is the "raised cosine pulse." A raised-cosine pulse and a corresponding eye diagram are shown in FIGS. 5A and 5B, respectively. Note that the raised cosine pulse has a non-zero amplitude at the center of the bit time and zero amplitude at $t=t_o+nT_o$, wherein $T_o$ is the bit time. The raised cosine pulse also retains half the amplitude at mid points ($t=t_o \pm 0.5\ T_o$). This means the raised cosine pulse causes zero interference midway between all signal bits. Note that there can exist other similar pulses that give ISI-free responses.

Figure 6A:
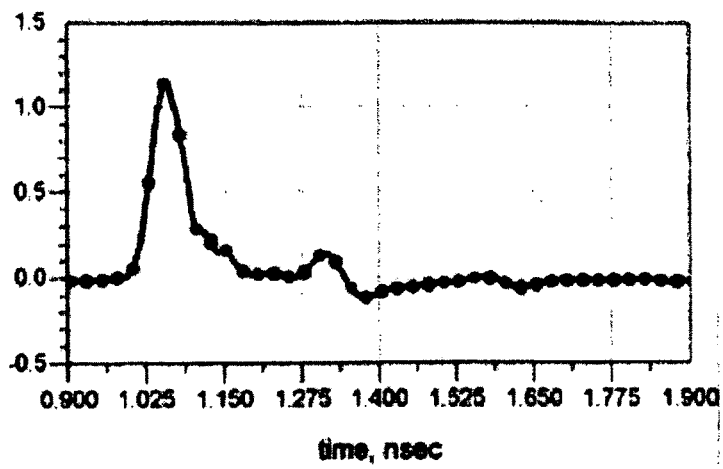
FIG. 6A illustrates an exemplary captured SBR.
Figure 6B:
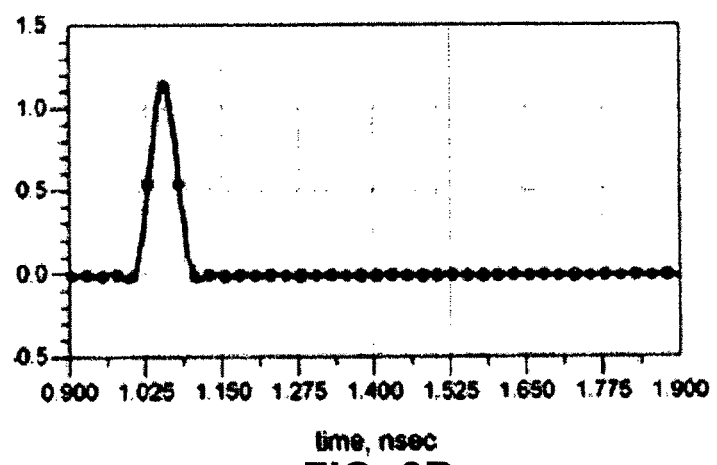
FIG. 6B illustrates an exemplary raised cosine pulse response pulse.
Figure 6C:
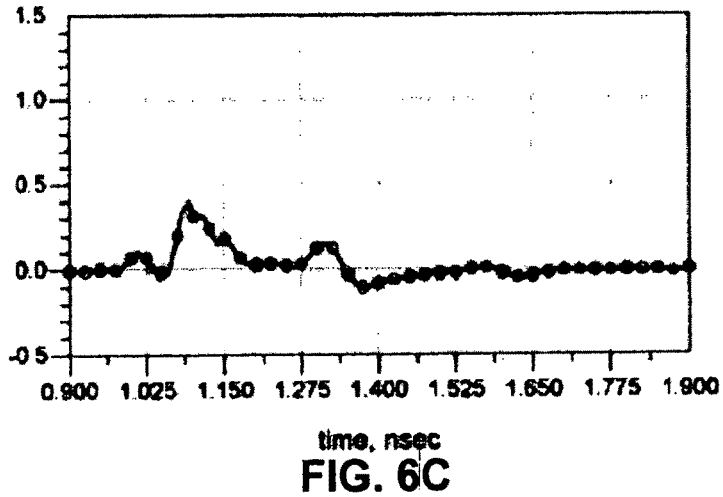
FIG. 6C illustrates an exemplary residual ISI waveform.

The single-bit response of a non-ideal system can be decomposed into distortionless SBR with raised-cosine pulse and ISI residual error. Once the single-bit response is obtained, the corresponding raised cosine response can be generated using the delay and amplitude of SBR at the center of the bit time. Next, the ISI residual error can be calculated by subtracting the raised cosine response from the SBR of the non-ideal system (as is illustrated in FIGS. 6A-6C).

The raised cosine waveform can be programmed into a chip through a register interface and stored in a memory. Furthermore, the system only needs to store non-zero samples that are a few bits long (e.g., 4-16 bits) for the raised cosine waveform (and only one bit long for NRZ). Note that the delay and amplitude for the raised cosine waveform can be determined during the calibration procedure described above.

Figure 7A:
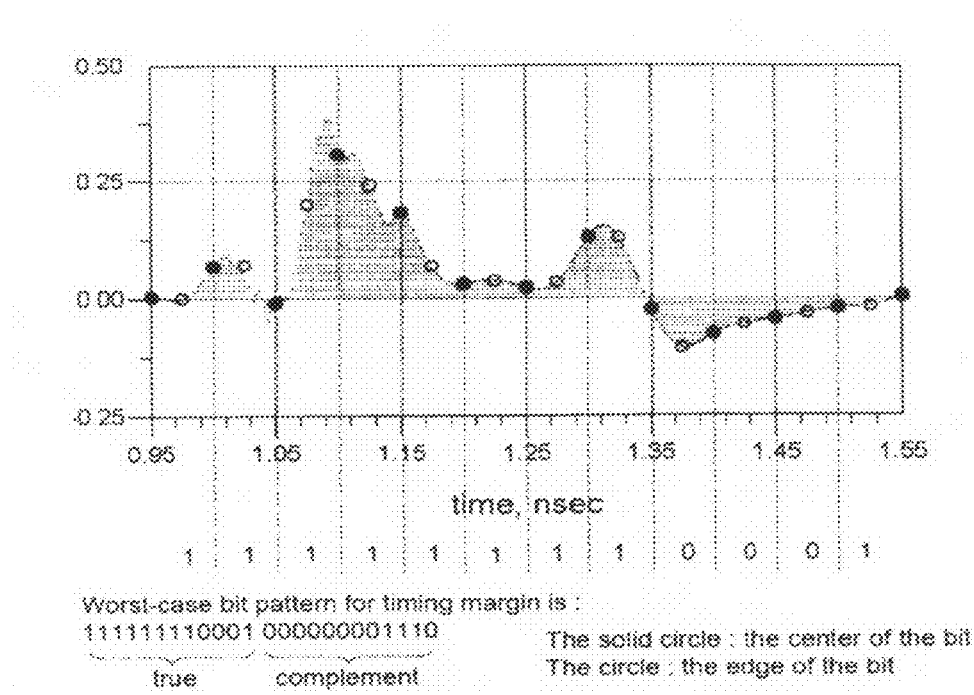
FIG. 7A illustrates an exemplary SBR and a raised cosine pulse.
Figure 7B:
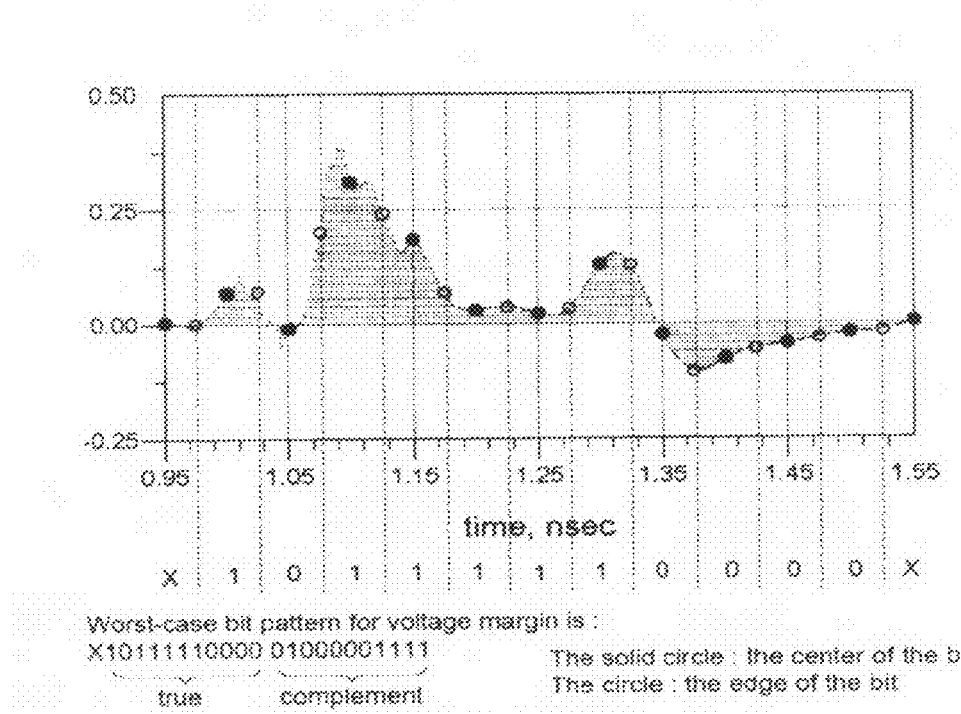
FIG. 7B illustrates an exemplary residual ISI waveform response pulse.

When the error waveform is constructed, the sample values around the center and the edges are used to determine a worst-case bit pattern which is used to determine the voltage and timing margins, respectively. Note that the samples around the dots and the circles in the residual illustrated in FIGS. 7A and 7B are used to determine the pattern to obtain the voltage and time margins of the system, respectively. Moreover, the length of the worst-case bit pattern can be determined by how long non-zero sample values continue to occur at the center and edges of the bit times of the SBR waveform.

Once the bit patterns are determined, eye diagrams can be generated using the patterns. Thus, the performance and eye centers can be extracted using very few bit patterns.

Figure 8A:
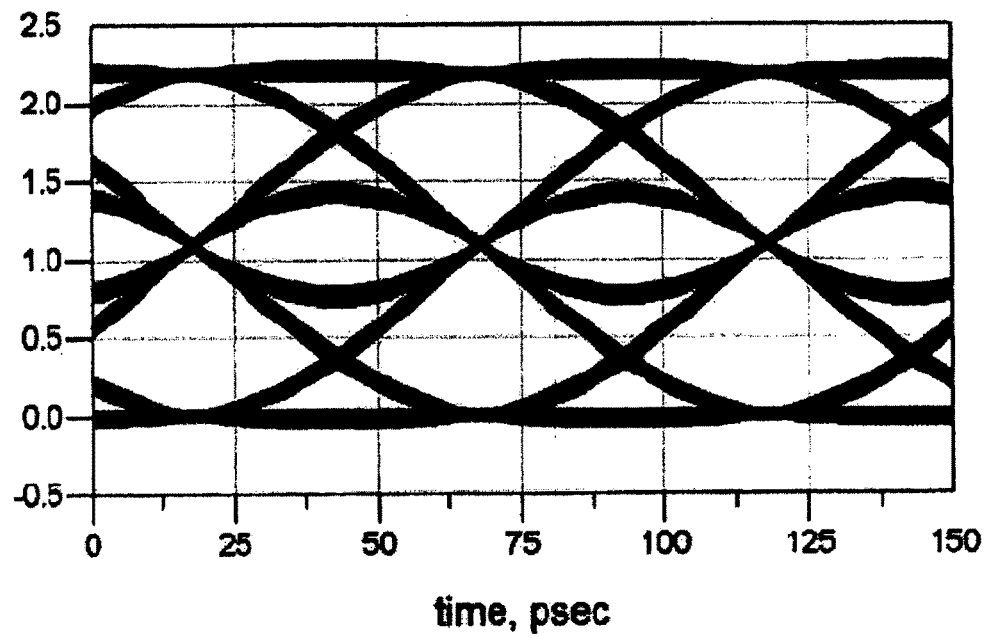
FIG. 8A illustrates an exemplary eye diagram of an ideal Duobinary system.
Figure 8B:
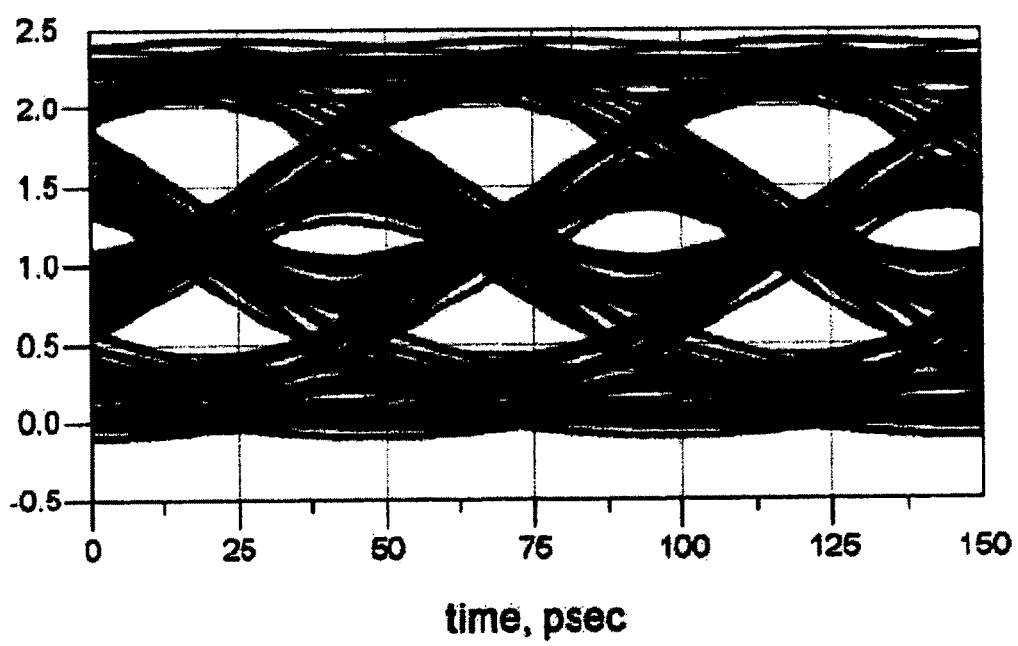
FIG. 8B illustrates an exemplary eye diagram of an actual Duobinary system.
Figure 9A:
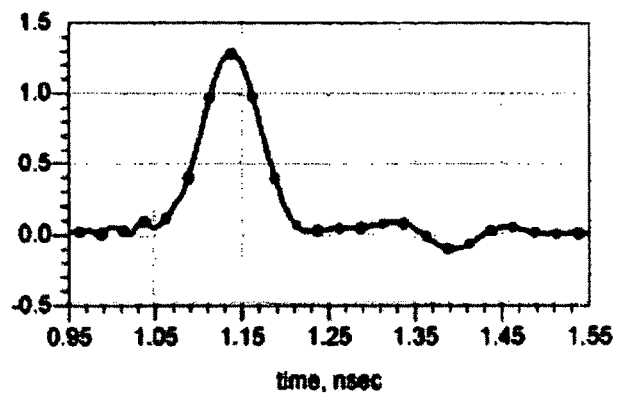
FIG. 9A illustrates an exemplary captured SBR for a Doubinary system.
Figure 9B:
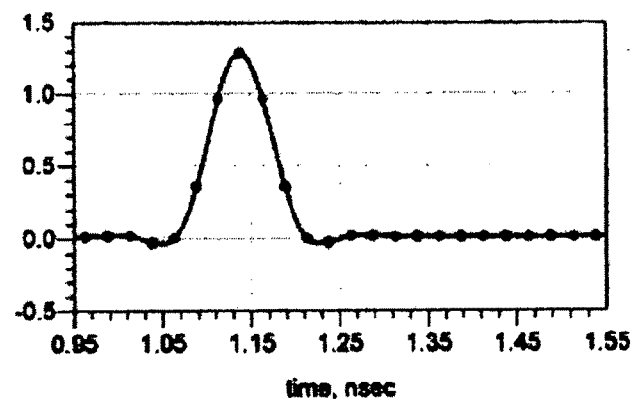
FIG. 9B illustrates an exemplary raised cosine pulse for a Doubinary system.
Figure 9C:
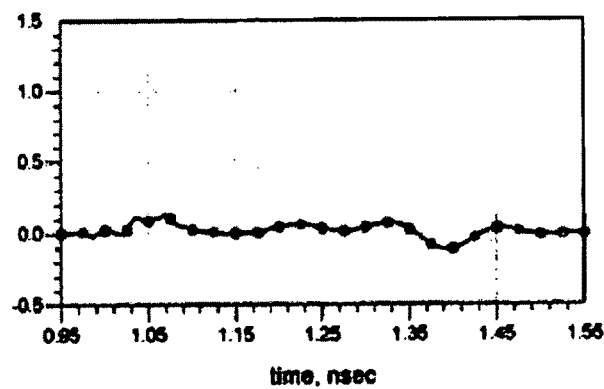
FIG. 9C illustrates an exemplary residual ISI waveform for a Doubinary system.

The above-described approach is more general than currently used techniques and can be applied to evaluate arbitrary signaling systems, including multilevel, partial response signaling and other NRZ and RZ signaling systems. For example, the eye diagrams of partial-response signaling with alpha mode ($\alpha=0.5$), also known as "Duobinary signaling," are shown in FIGS. 8A and 8B for ideal and actual systems, respectively. The SBR of the system can be decomposed similarly using the SBR of an ideal Duobinary system as shown in FIGS. 9A-9C. The associated residual error can similarly be used to construct the worst-case pattern.

Signaling System

Figure 10:
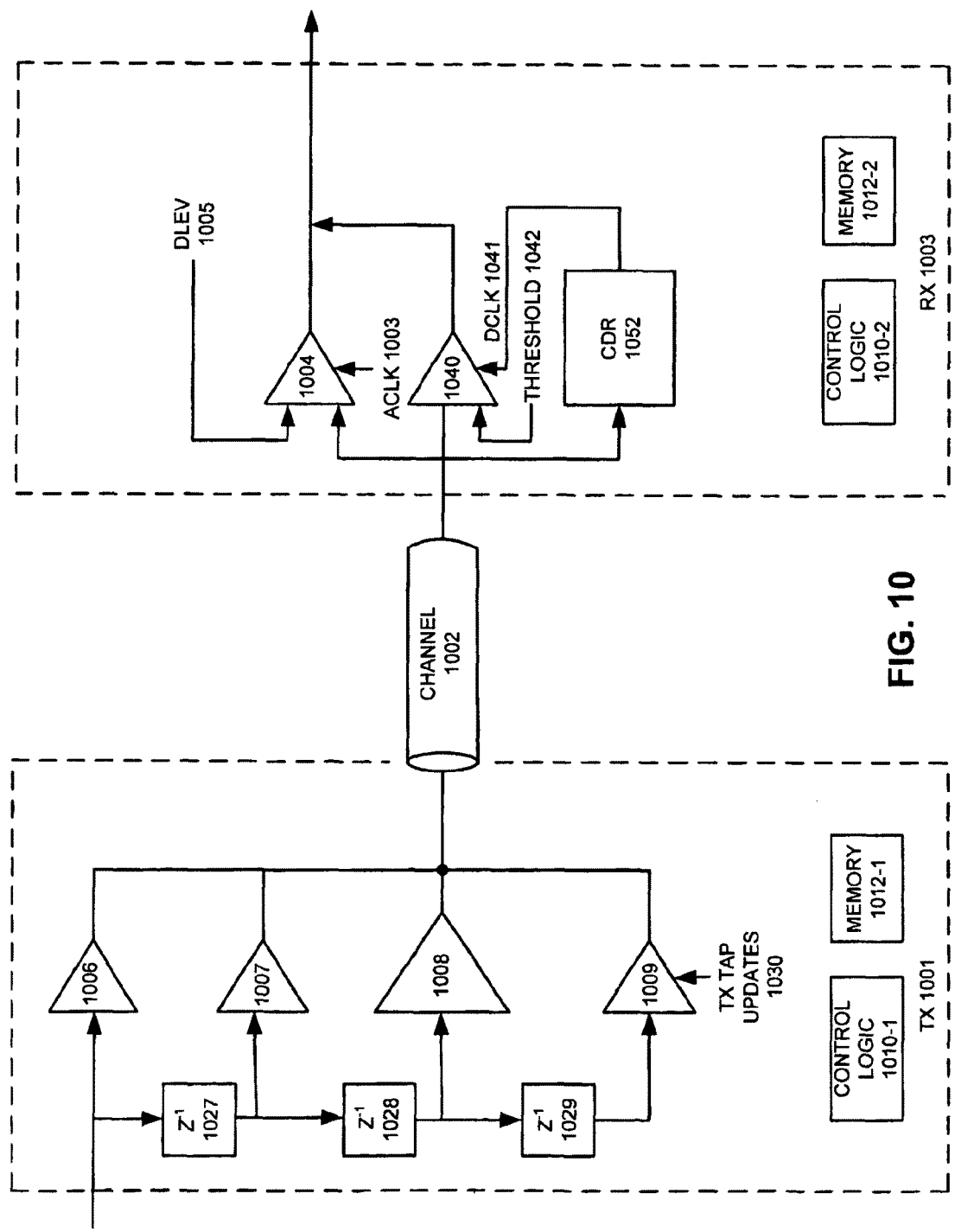
FIG. 10 illustrates an exemplary embodiment of a signaling system.

FIG. 10 illustrates an exemplary signaling system. Note that this signaling system can generally reside within any type of system that performs signaling operations between system components. In one embodiment, the signaling system transfers data between components in a computer system. For example, the signaling system can transfer data between a processor and a memory in a computer system. Thus, the signaling system may be used in: desktop or laptop computers, hand-held or portable devices (such as personal digital assistants and/or cellular telephones), set-top boxes, home networks, local area networks (LANs), and/or video-game devices.

The signaling system includes a transmitter (TX) 1001 and a receiver (RX) 1003 as well as a channel 1002, which couples TX 1001 with RX 1003. TX 1001 includes a number of drivers 1006-1009 which can be selectively activated to adjust transmission characteristics for TX 1001. In the illustrated embodiment, drivers 1006-1009 and associated delay elements 1027-1029 are used to implement taps for a transmit equalization filter. In this embodiment, transmit tap updates 1030 can be applied to adjust the drive strengths of the drivers 1006-1009 (and in doing so to adjust the coefficients of the transmit equalization filter taps) based on observed response characteristics of channel 1002. Although a specific embodiment of a transmitter is shown, in general any type of transmitter can be used.

Channel 1002 can include any type of communication channel (including wired, wireless, and/or optical) that couples together system components located on different integrated circuit (IC) chips or located on the same IC chip. For example, channel 1002 can include a bus line between chips or an inter-chip signal line.

RX 1003 can generally include any type of receiver circuit. In the illustrated embodiment, RX1003 includes a receiver 1040 with an associated DCLK signal 1041 and a voltage threshold signal 1042 which are used to capture received data. (Note that the timing for DCLK signal 1041 and the level of voltage threshold 1042 can be adjusted to optimize performance of the signaling system as is described in more detail below.) RX 1003 also includes a clock and data recovery circuit 1050, which generates DCLK signal 1041 from an approximate frequency reference, and then phase-aligns to the clock signal with transitions in the data stream, for example by using a phase-locked loop (PLL).

RX1003 illustrated in FIG. 10 has been augmented to include an additional receiver 1004, which can be used to capture a single bit response (SBR) for the signaling system from channel 1002. (This additional receiver 1004 and associated portions of control logic 1010-2 are sometimes referred to as a "measuring mechanism".) Note that the SBR can be captured by repeatedly transmitting the SBR from TX 1001 to RX 1003 and while doing so using receiver 1004 to capture the resulting waveform. This involves incrementally varying voltage level on the DLEV 1005 input to receiver 1004, and also incrementally varying the phase of the timing reference ACLK 1003 for receiver 1004 while the SBR is being repeatedly transmitted to obtain a stream of outputs which can be used to construct the SBR waveform.

Note that either or both of TX 1001 and RX 1003 may include control logic 1010-1 and 1010-2 to manage the transmitting and capturing of the repeated SBR signals as well as other operations described below with reference to FIG. 11 (for example, determining the ISI-residual and/or the calibration bit pattern). Moreover, control logic 1010-1 and 1010-2 can be associated with corresponding memories 1012-1 and 1012-2 for storing SBRs and worst-case bit patterns.

While not shown in FIG. 10, RX 1003 may provide feedback to the TX 1001 during the characterization of the communications between these devices. This feedback may be in-band or out-of-band, and may occur via the channel 1002 and/or a separate feedback link (not shown).

Furthermore, in some embodiments either or both of control logic 1010-1 and 1010-2 may determine that characterization or calibration of the channel is needed (for example, based on a mean-square error of received signals relative to a target pattern or an error rate).

Although the above-described system uses hardware-based structures to perform the measuring, testing and calibrating functions, other embodiments can perform these functions (or portions of these functions) using software.

Process of Determining Performance

Figure 11:
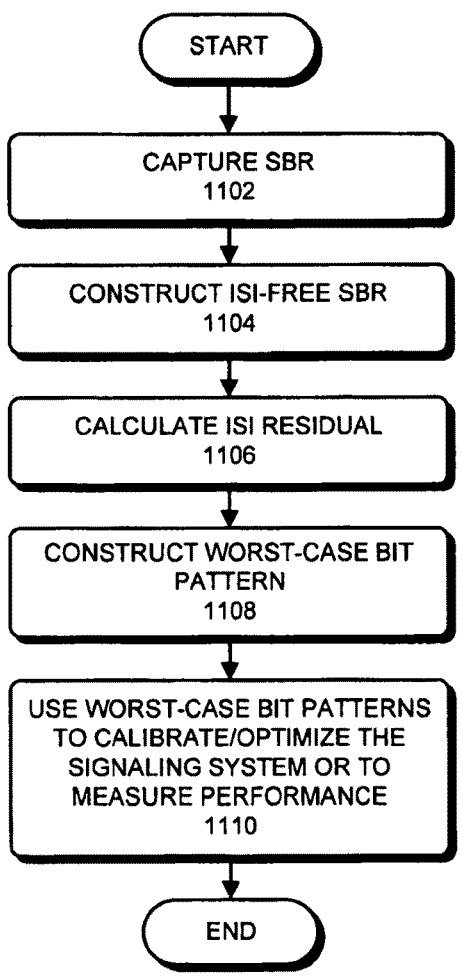
FIG. 11 presents a flow chart illustrating an exemplary process for determining performance of a signaling system.

FIG. 11 presents a flow chart illustrating the process of determining performance of a signaling system. This process can generally take place at any time. For example, the process can take place: during the process of manufacturing the signaling system; during system initialization; or during a periodic recalibration operation performed while the signaling system is operating.

During this process, the system first captures the SBR (step 1102). This can involve using the technique described above in relation to FIG. 10 to capture the SBR waveform. Next, the system uses the delay and amplitude of the captured SBR as parameters while constructing an idealized inter-symbol-interference-free (ISI-free) SBR (step 1104). In one embodiment, this idealized ISI-free SBR has the form of a raised cosine pulse or other suitable ISI-free pulse.

The system then calculates the ISI residual by subtracting the idealized ISI-free SBR from the captured SBR (step 1106).

Next, the system constructs the worst-case bit pattern from the ISI-residual (step 1108). Referring to FIG. 7, this can involve assigning logic one or logic zero value to successive bits in the calibration bit pattern based on the polarity of the ISI-residual at the centers or the edges of successive bit times. Alternatively, logic one or logic zero values can be assigned based on the polarity of an area within an interval surrounding the centers or the edges of successive bit times of the ISI-residual. (Note that the portions of control logic 1012-1 and 1012-2 and associated circuitry which are used to construct this worst-case bit pattern is sometimes referred to as a "computation mechanism.")

More specifically, error values are obtained by integrating or evaluating the ISI-residual around the centers or edges of the bits. The worst-case bit patterns are then constructed from these error values. While constructing the worst-case bit pattern for voltage margin, if the error value at the center of a bit is positive, then the worst-case bit sequence is assigned a logic one value. Alternatively, if the error value is negative, a logic zero value is assigned. Similarly, while constructing the worst-case bit pattern for timing margin, if the error value at the edge of a bit is positive, then the worst-case bit sequence is a assigned a logic one value. Alternatively, if the error value is negative, a logic zero value is assigned.

This worst-case bit pattern can be generated until a termination condition is reached. For example, the termination condition can be reached when the sample values at the centers or the edges of bit times approach zero, or after a pre-specified number of bits are generated. Next, the determined bit patterns are complemented and concatenated to produce the complete worst-case bit sequences for the voltage and timing margins. Once the worst-case bit pattern is constructed, it can be stored in memory 1012-1. Note that the worst-case bit pattern can be constructed once or periodically depending on the desired performance and environmental and operation conditions.

Finally, the system uses the worst-case bit pattern to calibrate or optimize the signaling system, or to measure the performance of the signaling system (step 1110). This can involve determining one or more of: a timing margin, a voltage margin, a true center of a signal eye, a channel performance, a bit error rate, other performance metrics. This can also involve calibrating the optimal sampling point of the received eye by adjusting the phase of the received clock. (Note that the portions of control logic 1012-1 and 1012-2 and associated circuitry which are used to determine the margins and other aspects of channel performance are sometimes referred to as a "testing mechanism" or a "calibration mechanism.")

This can additionally involve optimizing or calibrating equalization coefficients for digital filters for the signaling system and a CDR phase location. Once the worst-case bit patterns are determined, they can be used to efficiently find the optimal equalization coefficients that maximally increase the voltage and timing margins of the received eye. This can be done by adjusting the coefficient values when the worst-case patterns are transmitted.

Note that the above-described embodiments can generally be applied to improve performance in any system or application where data is transmitted through a channel. For example, the above-described embodiments can be applied to calibrate synchronization operations between a memory controller and a random-access memory (RAM) in a computer system. More generally, the above-described embodiments can be applied to optimize serial data links or parallel data links. They can also be applied during system initialization operations or during periodic system calibration operations.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method comprising:
   capturing a single-bit response (SBR) associated with a signaling system;
   constructing an idealized inter-symbol-interference-free (ISI-free) SBR for the signaling system which is substantially free of inter-symbol-interference (ISI);
   calculating an ISI-residual from the captured SBR and the idealized ISI-free SBR;
   constructing a calibration bit pattern for the signaling system that is based substantially on the ISI-residual; and
   using the calibration bit pattern to calibrate an aspect of the signaling system.

2. The method of claim 1, wherein constructing the idealized ISI-free SBR involves constructing a distortionless SBR using a raised cosine pulse.

3. The method of claim 1, wherein constructing the idealized ISI-free SBR involves using a delay of the SBR and an amplitude of the SBR as parameters while constructing the idealized ISI-free SBR.

4. The method of claim 1, wherein calculating the ISI-residual involves subtracting the idealized ISI-free SBR from the captured SBR.

5. The method of claim 1, wherein to calibrate an aspect of the signaling system involves calibrating at least one of:
   a timing margin;
   a voltage margin;
   a true center of a signal eye;
   a channel performance; and
   a bit error rate.

6. The method of claim 1, wherein to calibrate an aspect of the signaling system involves using the calibration bit pattern to generate an eye diagram for the signaling system.

7. The method of claim 1, wherein constructing the calibration bit pattern involves using non-zero sample values at the centers of bit times in the ISI-residual to construct the calibration bit pattern.

8. The method of claim 7, wherein constructing the calibration bit pattern involves assigning logic ones and logic zeros to successive bits in the calibration bit pattern based on the polarity of the ISI-residual at the centers of successive bit times.

9. The method of claim 7, wherein constructing the calibration bit pattern involves assigning logic ones and logic zeros to successive bits in the calibration bit pattern based on the polarity of an area in an interval surrounding the centers of successive bit times of the ISI-residual.

10. The method of claim 7, wherein the calibration bit pattern is generated until a termination condition is reached, wherein the termination condition is reached when at least one of the following conditions is true:
    the sample values at the centers of bit times approach zero; and
    after a pre-specified number of bits are generated.

11. The method of claim 1, wherein constructing the calibration bit pattern involves using non-zero sample values at the edges of bit times in the ISI-residual to construct the calibration bit pattern.

12. The method of claim 1, wherein determining the performance of the signaling system additionally involves calibrating the signaling system.

13. The method of claim 12, wherein calibrating the signaling system involves optimizing equalization coefficients for digital filters for the signaling system.

14. The method of claim 13, wherein optimizing the signaling system also involves optimizing and efficiently adapting the CDR phase location to optimize a sampling point for the signaling system.

15. The method of claim 1, wherein the signaling system is one of:
    a partial-response signaling system;
    a multi-level signaling system;
    a Doubinary signaling system;
    a modified Doubinary signaling system;
    a coded-signal-based signaling system;
    a binary non-return-to-zero signaling system; and
    a binary return-to-zero signaling system.

16. The method of claim 1, wherein the method is performed at one of the following times:
during the process of manufacturing the signaling system;
during system initialization; and
during a periodic recalibration operation performed while the signaling system is operating.

17. A method for calibrating a signaling system, comprising:
determining channel characteristics of the signaling system including
capturing a single-bit response (SBR) for the signaling system;
constructing an idealized inter-symbol-interference-free (ISI-free) SBR for the signaling system which is substantially free of inter-symbol-interference (ISI);
calculating an ISI-residual from the captured SBR and the idealized ISI-free SBR
constructing a calibration bit pattern for the signaling system that is based substantially on the ISI-residual; and
using the calibration bit pattern to calibrate an aspect of the signaling system.

18. The method of claim 17, wherein constructing the idealized ISI-free SBR involves constructing a distortionless SBR using a raised cosine pulse.

19. An apparatus that determines the performance of a signaling system, comprising:
a measuring mechanism configured to capture a single-bit response (SBR) associated with the signaling system;
a computation mechanism configured to,
construct an idealized inter-symbol-interference-free (ISI-free) SBR for the signaling system which is substantially free of inter-symbol-interference (ISI),
calculate an ISI-residual from the captured SBR and the idealized ISI-free SBR, and
construct a calibration bit pattern for the signaling system that is based substantially on the ISI-residual; and
a testing mechanism to use the calibration bit pattern to determine an aspect of the performance of the signaling system.

20. The apparatus of claim 19, wherein the computation mechanism is to construct the idealized ISI-free SBR by constructing a distortionless SBR using a raised cosine pulse.

21. The apparatus of claim 19, wherein the computation mechanism is to use a delay of the SBR and an amplitude of the SBR as parameters while constructing the idealized ISI-free SBR.

22. The apparatus of claim 19, wherein the computation mechanism is to calculate the ISI-residual by subtracting the idealized ISI-free SBR from the captured SBR.

23. The apparatus of claim 19, wherein the testing mechanism is to use the calibration bit pattern to determine at least one of:
a timing margin;
a voltage margin;
a true center of a signal eye;
a channel performance; and
a bit error rate.

24. The apparatus of claim 19, wherein the testing mechanism is to use the calibration bit pattern to generate an eye diagram for the signaling system.

25. The apparatus of claim 19, wherein the computation mechanism is to use non-zero sample values at the centers of bit times in the ISI-residual to construct the calibration bit pattern.

26. The apparatus of claim 25, wherein the computation mechanism is to assign logic ones and logic zeros to successive bits in the calibration bit pattern based on the polarity of the ISI-residual at the centers of successive bit times.

27. The apparatus of claim 25, wherein the computation mechanism is to assign a logic ones and logic zeros to successive bits in the calibration bit pattern based on the polarity of an area in an interval surrounding the centers of successive bit times of the ISI-residual.

28. The apparatus of claim 25, wherein the computation mechanism is to generate the calibration bit pattern until a termination condition is reached, wherein the termination condition is reached when at least one of the following conditions is true:
the sample values at the centers of bit times approach zero; and
after a pre-specified number of bits are generated.

29. The apparatus of claim 19, wherein the computation mechanism is to use non-zero sample values at the edges of bit times in the ISI-residual to construct the calibration bit pattern.

30. The apparatus of claim 19, further comprising a calibration mechanism to use the determined aspect of the performance of the signaling system to calibrate the signaling system.

31. The apparatus of claim 30, wherein the calibration mechanism is to calibrate equalization coefficients for digital filters for the signaling system.

32. The apparatus of claim 30, wherein the calibration mechanism is to efficiently adapt a clock data recovery (CDR) phase location to optimize the sampling point.

33. The apparatus of claim 19, wherein the signaling system is one of:
a partial-response signaling system;
a multi-level signaling system;
a Doubinary signaling system;
a modified Doubinary signaling system;
a coded-signal-based signaling system;
a binary non-return-to-zero signaling system; and
a binary return-to-zero signaling system.

34. The apparatus of claim 19, wherein the apparatus is to determine the performance at one of the following times:
during the process of manufacturing the signaling system;
during system initialization; and
during a periodic recalibration operation performed while the signaling system is operating.

35. An apparatus that calibrates a signaling system, comprising:
a measuring mechanism to determine channel characteristics of the signaling system and to capture a single-bit response (SBR) for the signaling system;
a bit-pattern generation mechanism to
construct an idealized inter-symbol-interference-free (ISI-free) SBR for the signaling system which is substantially free of inter-symbol-interference (ISI),
calculate an ISI-residual from the captured SBR and the idealized ISI-free SBR,
construct a calibration bit pattern for the signaling system that is based substantially in the ISI-residual; and
a calibration mechanism to use the calibration bit pattern to calibrate an aspect of the signaling system.

36. The apparatus of claim 25, wherein the idealized ISI-free SBR involves a distortionless SBR using a raised cosine pulse.

* * * * *